(12) United States Patent
Talalaevski et al.

(10) Patent No.: US 7,608,470 B2
(45) Date of Patent: Oct. 27, 2009

(54) INTERCONNECTION DEVICE INCLUDING ONE OR MORE EMBEDDED VIAS AND METHOD OF PRODUCING THE SAME

(75) Inventors: Alexander Talalaevski, Jerusalem (IL); Eyal Bar-Sadeh, Jersualem (IL); Shlomy Tubul, Modiin (IL)

(73) Assignee: Intel Corporation, Santa Clara, CA (US)

( * ) Notice: Subject to any disclaimer, the term of this patent is extended or adjusted under 35 U.S.C. 154(b) by 182 days.

(21) Appl. No.: 11/167,124

(22) Filed: Jun. 28, 2005

(65) Prior Publication Data

US 2006/0289995 A1 Dec. 28, 2006

(51) Int. Cl.
*H01L 27/14* (2006.01)
*H01L 21/00* (2006.01)

(52) U.S. Cl. .............. 438/22; 438/48; 438/51; 438/64; 257/E21.499; 257/E21.522; 257/414

(58) Field of Classification Search ............ 438/22, 438/48, 50–53, 63, 64; 257/414, 417, 467, 257/E21.499, E21.522
See application file for complete search history.

(56) References Cited

U.S. PATENT DOCUMENTS

| | | | |
|---|---|---|---|
| 5,401,672 A | 3/1995 | Kurtz et al. | |
| 6,529,348 B2 * | 3/2003 | Maruyama et al. | 360/245.9 |
| 6,846,725 B2 * | 1/2005 | Nagarajan et al. | 438/456 |
| 6,936,918 B2 * | 8/2005 | Harney et al. | 257/704 |
| 6,961,245 B2 * | 11/2005 | Ikuta et al. | 361/719 |
| 7,084,505 B2 * | 8/2006 | Hamada et al. | 257/758 |
| 7,195,946 B2 * | 3/2007 | D'Arrigo et al. | 438/54 |
| 7,199,307 B2 * | 4/2007 | McCormack et al. | 174/260 |
| 7,335,972 B2 * | 2/2008 | Chanchani | 257/686 |
| 2003/0128907 A1 * | 7/2003 | Kikuchi et al. | 385/14 |
| 2004/0112633 A1 | 6/2004 | Endo et al. | |
| 2006/0001123 A1 | 1/2006 | Heck et al. | |

FOREIGN PATENT DOCUMENTS

| | | |
|---|---|---|
| CN | 1484280 | 3/2004 |
| EP | 0534733 | 3/1993 |
| EP | A-0534733 | 3/1993 |
| EP | A-1037275 | 9/2000 |
| JP | 10-256363 | 9/1998 |

OTHER PUBLICATIONS

International Search Report —International Application No. PCT/US2006/026216 - Date of completion of the International Search Oct. 11, 2006.
Chinese Office Action of Application No. 200610121498.2 Dated Sep. 12, 2008.

* cited by examiner

*Primary Examiner*—Hsien-ming Lee
(74) *Attorney, Agent, or Firm*—Pearl Cohen Zedek Latzer, LLP (57) ABSTRACT

"An interconnection device comprises a Systems In Package (SIP) device, or Systems in Chip (SIC) device, including one or more embedded vias extending through a base substrate. A process to produce the interconnection device."

4 Claims, 7 Drawing Sheets

INTERCONNECTION DEVICE INCLUDING ONE OR MORE EMBEDDED VIAS AND METHOD OF PRODUCING THE SAME

BACKGROUND OF THE INVENTION

Interconnection devices, e.g., semiconductor application interconnection devices, may include, for example, Systems In Package (SIP) devices, or Systems In Chip (SIC) devices. The interconnection devices may include a silicone substrate to support one or more electronic components, for example, electro-mechanical devices, e.g., Micro-Electro-Mechanical Systems (MEMS) devices; and/or embedded electric devices, e.g., conductors, resistors and/or capacitors.

Such interconnection devices may also include one or more Through-Silicon-Vias (TSVs) formed within the substrate to electrically connect the electronic components to one or more other, e.g., external, devices.

A conventional process for producing the interconnection devices may include forming one or more channels in a high resistance silicone substrate by a dry or wet deep silicone etching process; forming an isolation layer over the surface of the channels, e.g., by depositing or spraying a dielectric material over the surface of the channels; and depositing one or more conductors within the channels.

The conventional process for producing the interconnection devices may be relatively complex, expensive, and/or time consuming. In addition, the conventional process may require a relatively high degree of accuracy, e.g., to ensure sufficient isolation between the TSVs and the silicone substrate.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanied drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits may not have been described in detail so as not to obscure the present invention.

Although some demonstrative embodiments of the invention are described herein with reference to a Systems In Package (SIP) device, it will be appreciated by those skilled in the art that aspects of the present invention may be applicable to any other interconnection device, for example, any other semiconductor application interconnection device, e.g., a Systems In Chip (SIC) device.

Although the present invention is not limited in this regard, the term "MEMS device" as used herein may be understood to include, among other things, any suitable Micro-Electro-Mechanical Systems device, for example, a Film Bulk Acoustic Resonator (FBAR) filter, a FBAR Radio Frequency (RF) filter, an RF switch, a varactor, a tunable capacitor, or any other MEMS device where it may be relevant to apply the principles of the present invention.

It will be appreciated that the terms "top" and "bottom" may be used herein for demonstrative purposes only, to illustrate the relative positioning or placement of certain components, and/or to indicate a first and a second component. The terms "top" and "bottom" as used herein do not necessarily indicate that a "top" component is above a "bottom" component, as such directions and/or components may be flipped, rotated, moved in space, placed in a diagonal orientation or position, placed horizontally or vertically, or similarly modified.

Although the present invention is not limited in this regard, the term "inter layer dielectric (ILD) section" as used herein may refer to a layer, section, portion, segment, part, and/or sector including a material or substance characterized by a relatively low dielectric constant, e.g., a material or substrate having a low-k dielectric constant. For example, the dielectric constant of the ILD may be smaller than the dielectric constant of silicone oxide, e.g., smaller than 3.9.

Although the invention is not limited in this regard, in some demonstrative embodiments of the invention the ILD may include a porous material or substance, e.g., Oxidized Porous Silicone (OPS), including, for example, a plurality of gaps, e.g., air gaps; and having very low dielectric constant, for example, a dielectric constant smaller than 2, e.g., a dielectric constant of 1.3.

Figure 1:
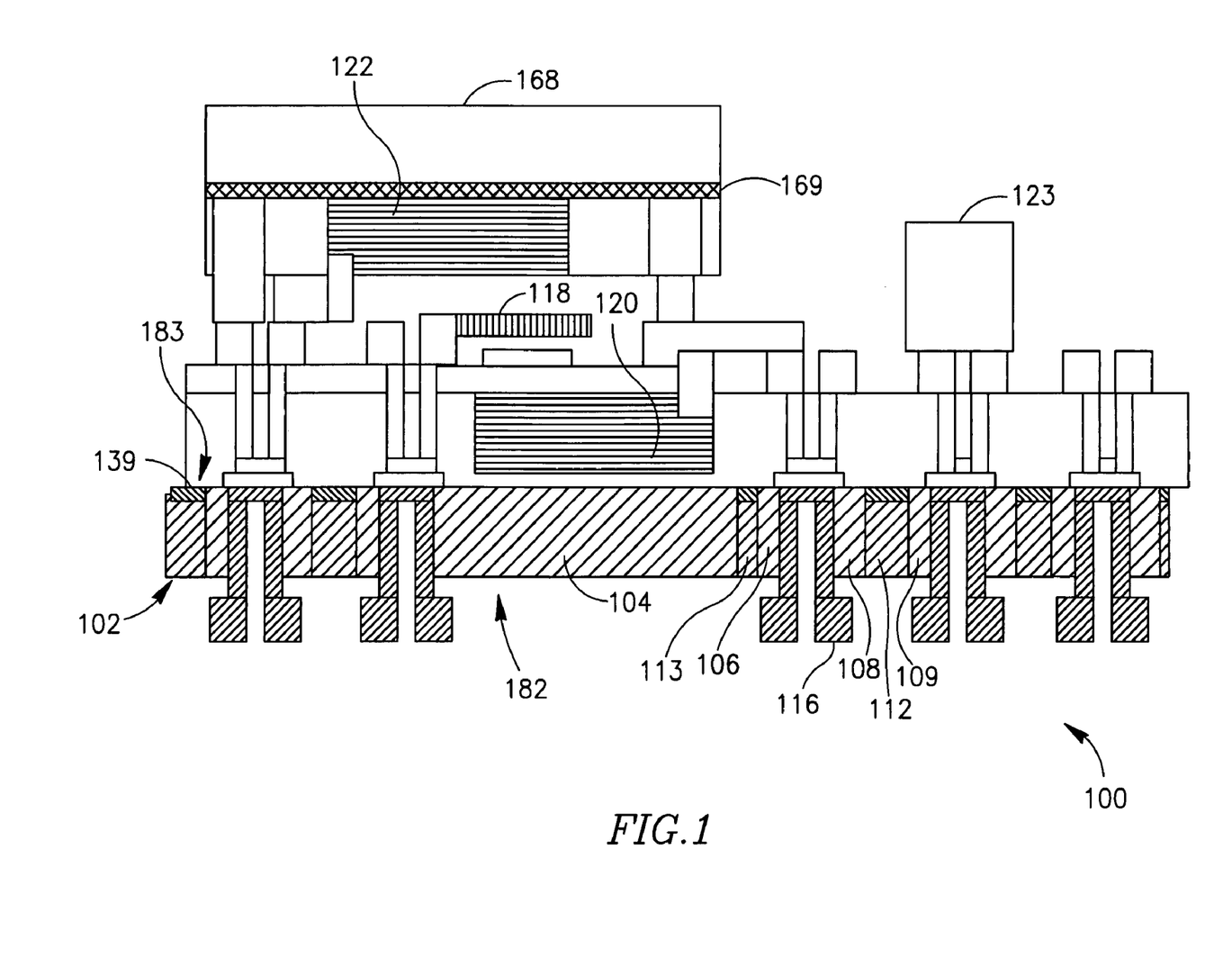
FIG. 1 is a schematic illustration of an interconnection device in accordance with some demonstrative embodiments of the present invention.

Reference is made to FIG. 1, which schematically illustrates an interconnection device 100 in accordance with demonstrative embodiments of the present invention.

Although the invention is not limited in this respect, device 100 may include, for example, a SIP.

According to some demonstrative embodiments of the invention, device 100 may include a base substrate 102. Base substrate 102 may include at least one ILD section 104; and one or more vias 116 embedded in base substrate 102 and in direct contact with ILD section 104, as described in detail below.

According to some demonstrative embodiments of the invention, ILD section 104 may be formed of any suitable material, e.g., OPS. Although the present invention is not limited in this regard, in demonstrative embodiments of the present invention ILD section 104 may have a dielectric constant smaller than 3.9, for example, a dielectric constant smaller than 3, e.g., a dielectric constant of between 2.3 and 2.7. In some embodiments of the invention ILD section 104 may have any other suitable dielectric constant, for example, a dielectric constant of between 1 and 2.3, e.g., a dielectric constant of between 1 and 1.5.

Although the present invention is not limited in this regard, in demonstrative embodiments of the present invention ILD section 104 may have a thickness of more than 5 micrometers, e.g., a thickness of more than 50 micrometers. ILD section 104 may have any other suitable thickness, e.g., a thickness of more than 200 micrometers.

According to some demonstrative embodiments of the invention, vias 116 may be formed of any suitable conductive material, for example, any suitable metal, e.g., Aluminum or Copper.

Vias 116 may be constructed in any suitable shape or form, and may include any suitable components, as may be required in accordance with specific implementations and/or designs. An Aspect Ratio (AR) of a via may be determined, for example, as a ratio between a length of the via, and a diameter or width of the via, e.g., as is known in the art. Although the invention is not limited in this respect, in some demonstrative embodiments of the invention the AR of one or more of vias 116 may be larger than one, for example, larger than two, e.g., larger than 10.

According to some demonstrative embodiments of the invention, base substrate 102 may also include one or more low-resistance sections, e.g., sections 112 and/or 113. For example, sections 112 and/or 113 may be formed of any suitable semiconductive material having low electrical resistance, e.g., low-resistance Silicone as is known in the art. The one or more low-resistance sections may be isolated from vias 116 by ILD section 104. For example, section 112 may be isolated from vias 116 by portions 108, and 109 of ILD section 104.

According to some demonstrative embodiments of the invention, device 100 may also include one or more electronic components supported by base substrate 102. For example, device 100 may include at least one MEMS device 118; at least one embedded electric device, e.g., embedded electrical devices 120 and 122; and/or any other electric device, e.g., device 123, attached to base substrate 102. Embedded devices 120 and/or 122 may include, for example, one or more capacitors, resistors, and/or inductors, e.g., including one or more Radio Frequency (RF) capacitors, resistors, and/or inductors, as are known in the art.

In some demonstrative embodiments of the invention, vias 116 may be used, for example, to electrically connect MEMS device 118; embedded devices 120 and/or 122; and/or device 123 to other components and/or circuits of a device and/or a system incorporating interconnection device 100. In some demonstrative embodiments, one or more of vias 116 may include a through via extending between a first side 182 of substrate 102, and a second side 183 of substrate 102.

It will be appreciated by persons skilled in the art that, although the above description with reference to the schematic illustration of FIG. 1 may depict a generally planar interconnection device and/or components placed generally parallel to each other, the present invention is not limited in this regard. Embodiments of the present invention may include interconnection devices that are not planar, and/or components that are not parallel or generally parallel to each other.

Figure 2:
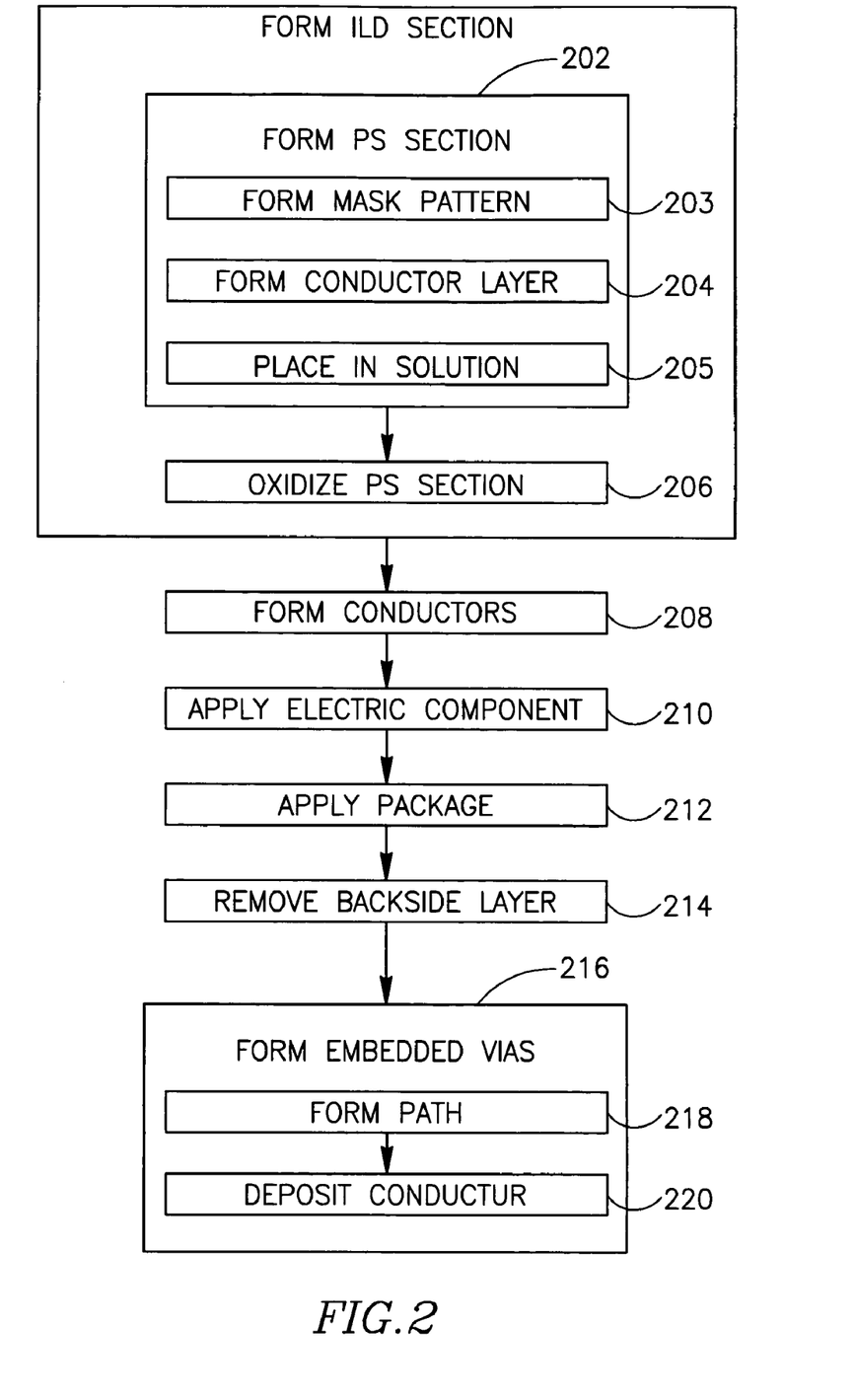
FIG. 2 is a schematic flowchart depicting a process for producing an interconnection device in accordance with some demonstrative embodiments of the present invention.

Reference is made to FIG. 2, which schematically illustrates a flowchart of a process for producing an interconnection device, for example, device 100 (FIG. 1) according to some demonstrative embodiments of the invention; and to FIGS. 3A-3J, which schematically illustrate demonstrative stages in the process of FIG. 2 and demonstrative components useful in understanding the process.

Although the present invention is not limited in this regard, the term "producing" as used herein with reference to an item, may be understood to include, inter alia, manufacturing or assembling the item, providing a pre-fabricated item, or processing a partly formed item.

According to demonstrative embodiments of the invention, the process may include forming at least one ILD section within a base substrate, as indicated at block 200 of FIG. 2.

According to some demonstrative embodiments of the invention, forming the ILD section may include forming at least one Porous Silicone (PS) section in a low-resistance substrate, as indicated at block 202 of FIG. 2.

Figure 3A:
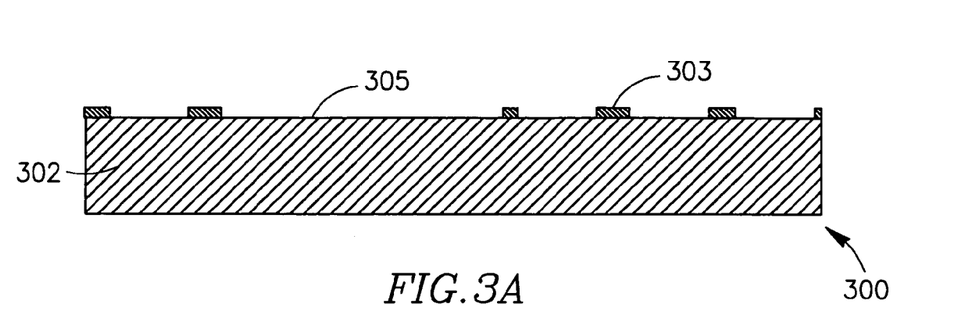
FIGS. 3A-3I are schematic illustrations of an interconnection device at different stages in the process of FIG. 2.

As indicated at block 203 of FIG. 2, forming the PS section in the low-resistance substrate may include, for example, forming a mask pattern over a first surface of the low resistance substrate, e.g., according to a desired shape, configuration and/or arrangement of the PS section. As shown in FIG. 3A, a resulting part 300 of the above operations may include a low-resistance substrate 302, and a mask pattern 303 formed on a first surface 305 of substrate 302. Substrate 302 may be formed, for example, from low-resistance Silicone. Mask pattern 303 may be formed, for example, from any suitable material, e.g., Silicone-Nitride. Forming mask pattern 303 may include, for example, depositing a layer of Silicone Nitride onto surface 305 using any suitable method, e.g., a Low Pressure Chemical Vapor Deposition (LPCVD), as is known in the art. Forming mask pattern 303 may also include forming pattern 303 using any material removing method, for example, any suitable photolithographic and/or etching process, as are known in the art.

Figure 3B:
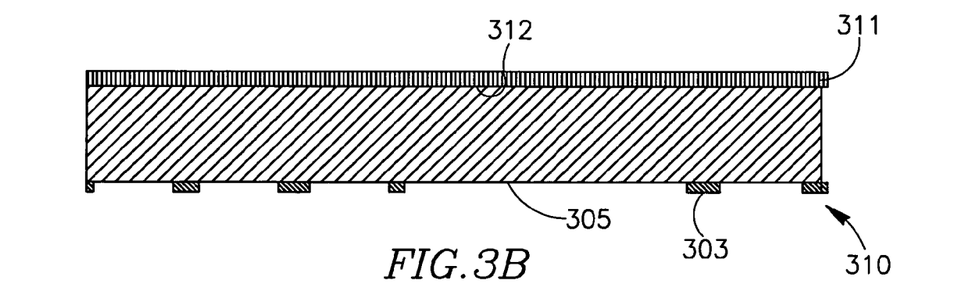

Forming the PS section within the low-resistance substrate may also include, for example, forming a conductor layer over a second surface of the low-resistance substrate, as indicated at block 204 of FIG. 2. As shown in FIG. 3B, a resulting part 310 of the above operations may include a conductor layer 311 formed over a second surface 312 of substrate 302, e.g., opposite surface 305. Layer 311 may be formed, for example, from any suitable metallic material, e.g., Boron, Arsenic, Phosphorous, Titanium Sillicide, and/or Cobalt Sillicide. Layer 311 may be formed using any suitable process, e.g., deposition, plating, evaporation, implantation, and/or silidization, as are known in the art.

Figure 3C:
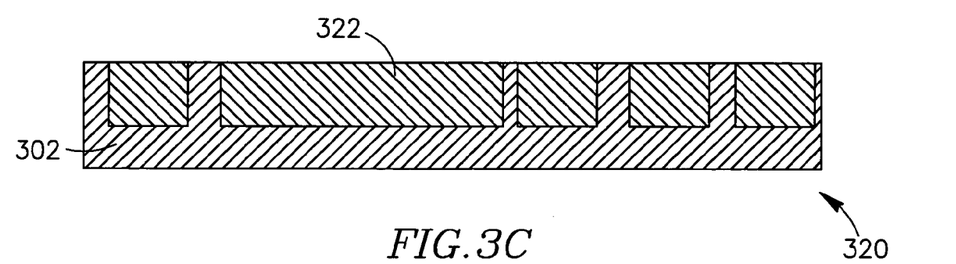

As indicated at block 205 of FIG. 2, forming the PS section in the low-resistance substrate may also include, for example, placing part 310 in a suitable solution, e.g., a solution including any suitable combination of Hydrogen-Fluoride (HF) and Ethanol as is known in the art. As shown in FIG. 3C, a resulting part 320 of the above operations may include one or more PS sections 322 formed within substrate 302.

Figure 3D:
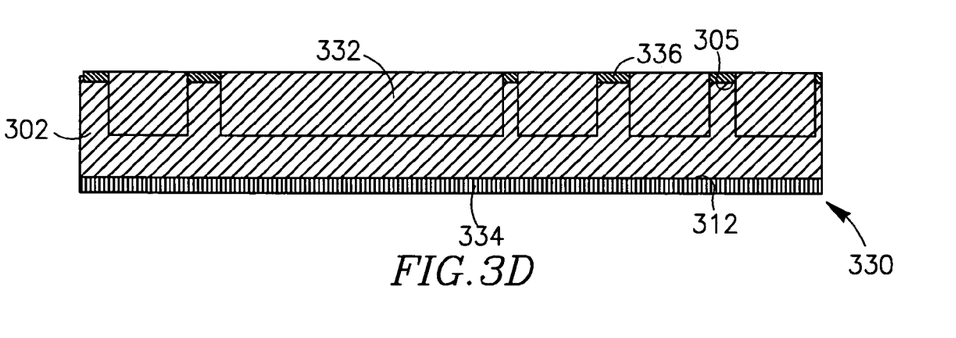

As indicated at block 206 of FIG. 2, forming the ILD section may also include oxidizing the at least one PS section. For example, oxidizing the PS section may include applying a wet oxidizing process, e.g., as is known in the art, to part 310. As shown in FIG. 3D, a base substrate 330 resulting of the above operations may include at least one OPS section 332. Although the present invention is not limited in this regard, in some demonstrative embodiments of the invention OPS section 332 may have a thickness of more than 5 micrometers, for example, a thickness of more than 50 micrometers, e.g., a thickness of more than 200 micrometers. In some demonstrative embodiments Base substrate 330 may also include a layer 334 of Silicone Oxide ("the backside layer") formed over at least part of surface 312, and/or one or more Silicone Oxide portions 336, e.g., formed over at least part of surface 305. Layer 334 and/or portions 336 may be formed, for example, by oxidizing one or more portions of substrate 302, e.g., during the wet oxidizing process.

As indicated at block 208 of FIG. 2, the process may also include forming a pattern of conductors over the OPS section.

Figures 3E, 3F:
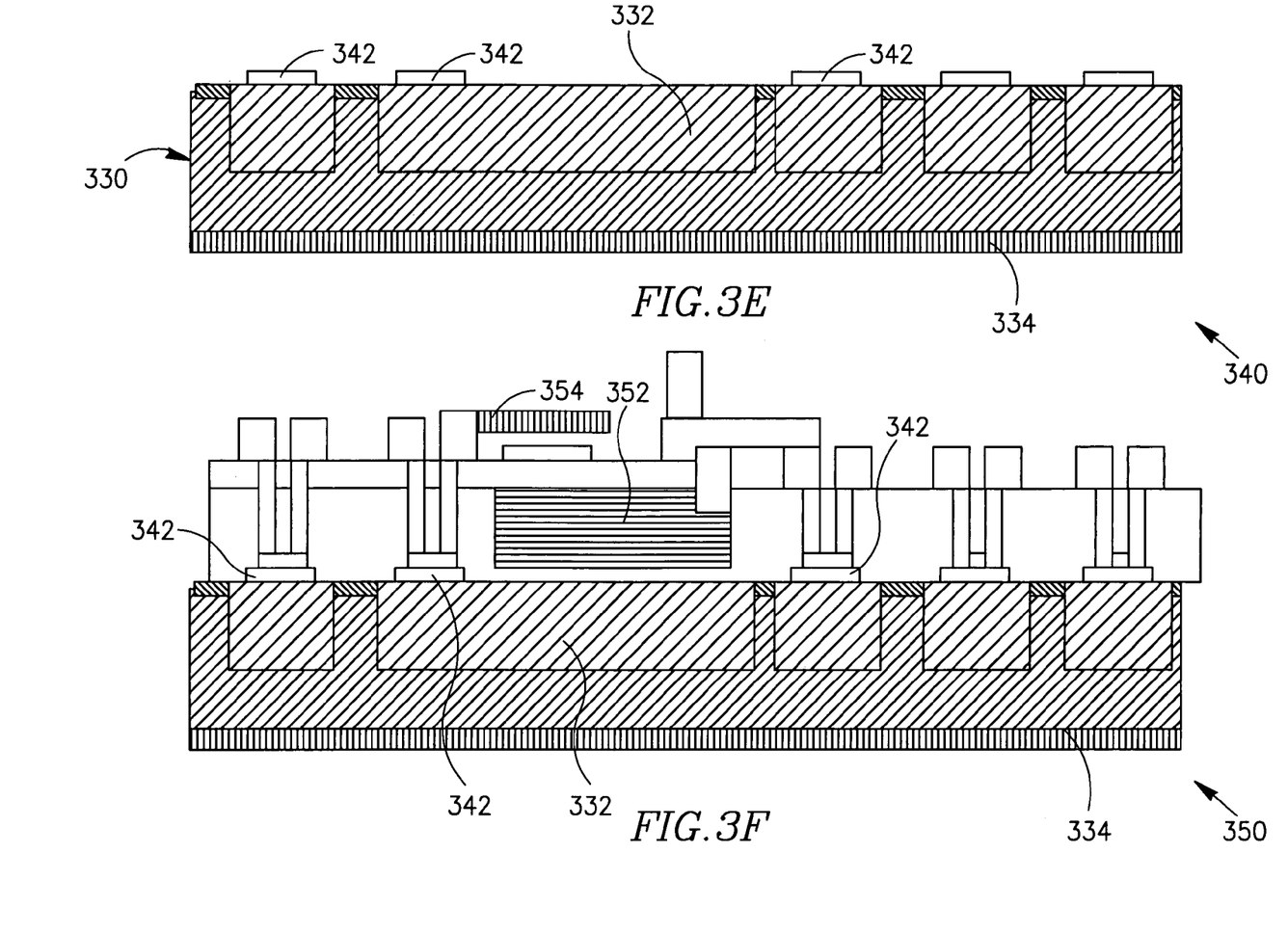

As shown in FIG. 3E, a resulting part 340 of the above operations may include one or more conductors 342, e.g., supported by base substrate 330. Conductors 342 may be attached, for example, to OPS section 332. Conductors may be formed of any suitable conductive material, e.g., Aluminum, Copper, and/or Silver. Conductors 342 may be formed, for example, using any suitable deposition and/or patterning process, e.g., as are known in the art.

As indicated at block 210 of FIG. 2, the process may also include attaching one or more electronic components to the base substrate. The electronic components may include any suitable electronic components, e.g., one or more elements of a MEMS device and/or an embedded electric device. As shown in FIG. 3F, a resulting part 350 of the above operations may include one or more embedded integrated circuits 352 and/or one or more MEMS devices 354, e.g., electrically connected to conductors 342. Embedded integrated circuits 352 and/or MEMS devices 354 may be attached to base substrate 330, for example, using any suitable fabrication process, e.g., as is known in the art.

As indicated at block 212 of FIG. 2, the process may further include applying a cap, package and/or insulation layer over the one or more electronic components. Applying the cap, package and/or insulation layer may include using any suitable packaging process, e.g., as is known in the art.

Figure 3G:
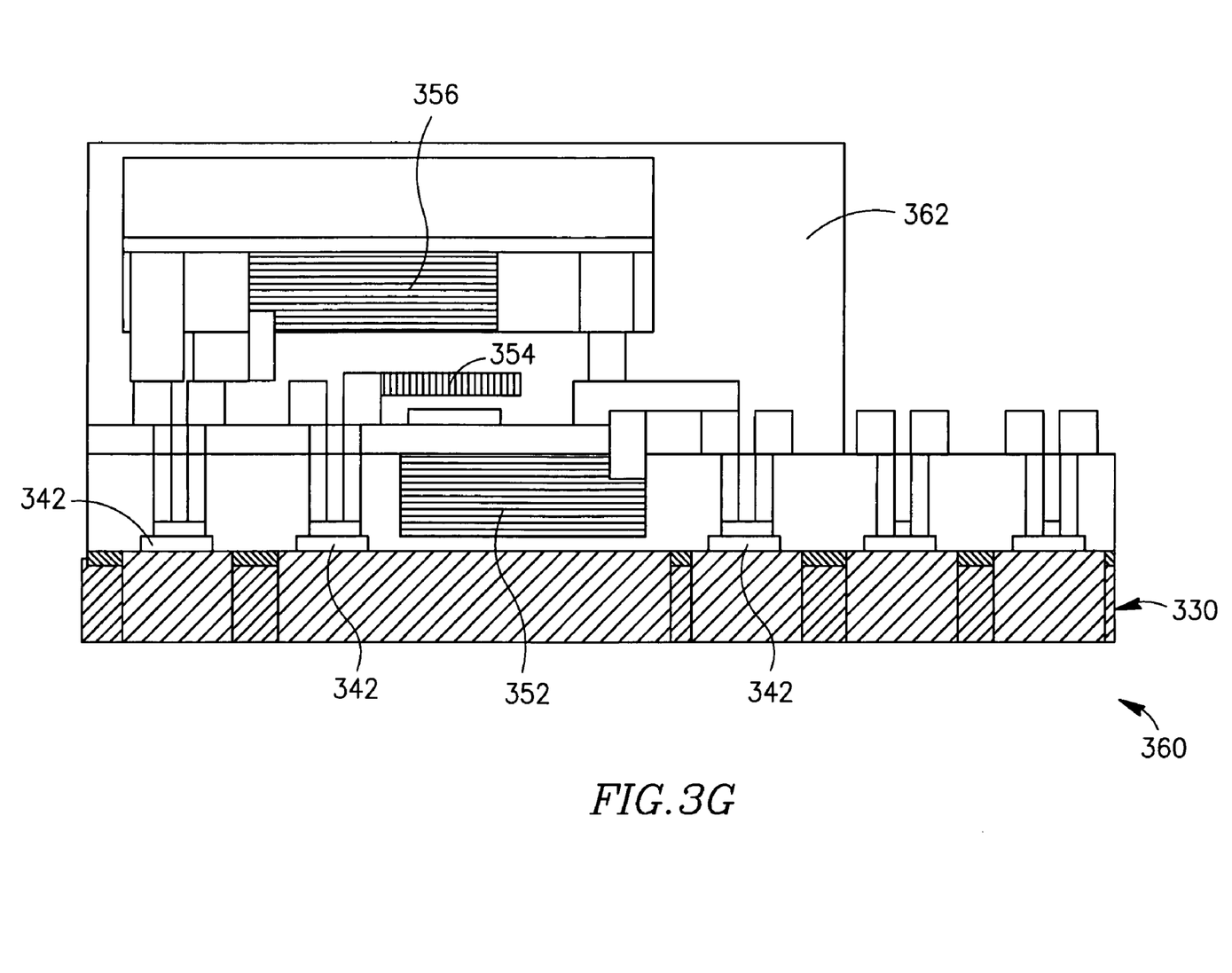

As indicated at block 214 of FIG. 2, the process may continue with substantially removing backside layer 334, e.g., using any suitable grinding process as is known in the art. As shown in FIG. 3G, a resulting part 360 of the above operations may include a package 362 covering devices 352 and/or 354. Part 360 may also include one or more additional embedded integrated circuits 356, which may be attached to part 350, for example using any suitable fabrication process.

As indicated at block 216 of FIG. 2, the process may also include forming one or more embedded vias in the base substrate and in direct contact with the ILD section.

Figure 3H:
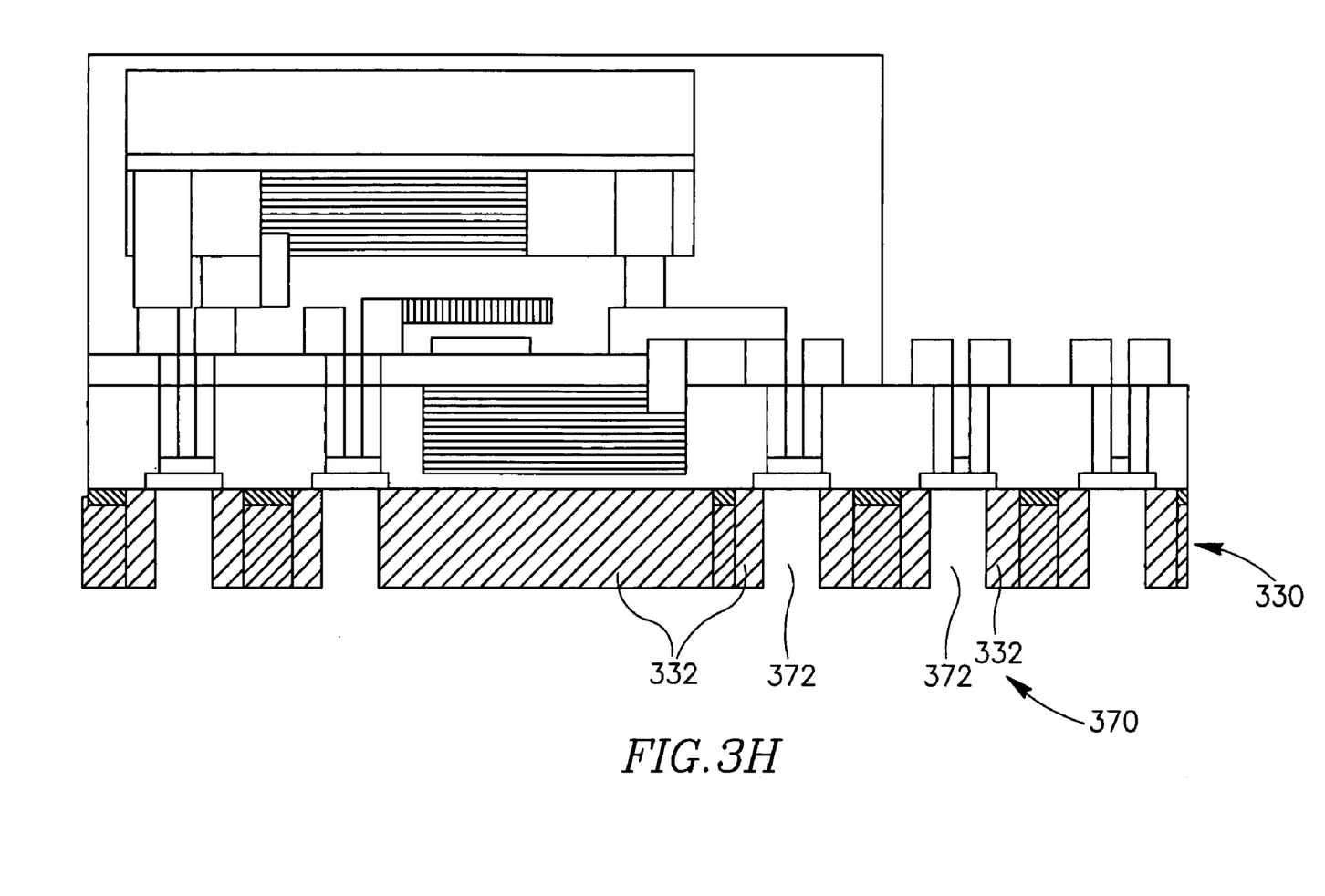

As indicated at block 218, forming the vias may include forming one or more paths within the ILD section, e.g., by selectively etching the ILD section. Selectively etching the ILD section may include, for example, using any suitable etching process, e.g., a deep etching process as is known in the art. As shown in FIG. 3H, a resulting part 370 of the above operations may include one or more paths formed within OPS section 332.

Figure 3I:
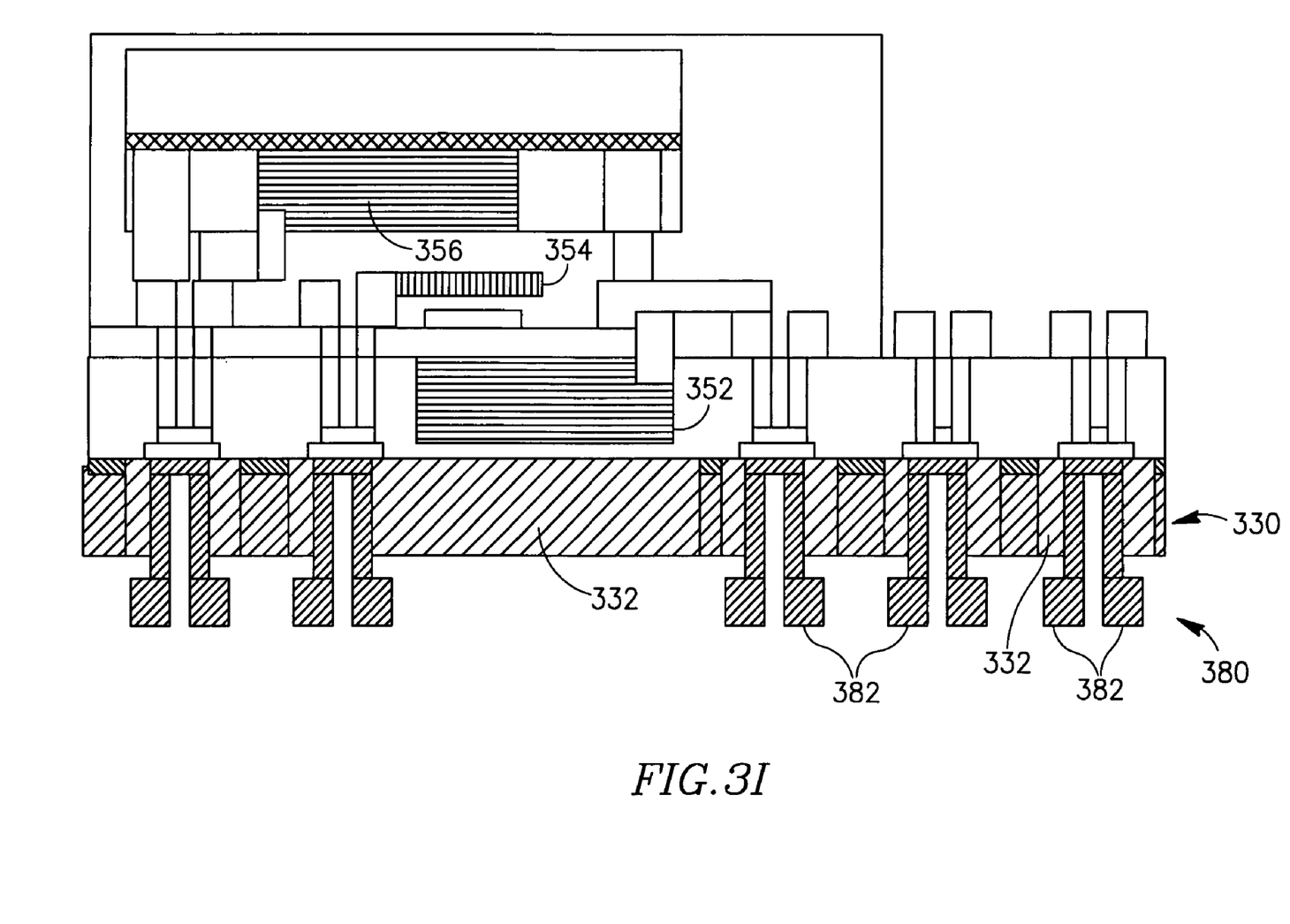

As indicated at block 220 of FIG. 2, forming the embedded vias may also include depositing one or more conductors in the one or more paths to form the one or more vias, respectively. As shown in FIG. 3I, a resulting part 380 of the above operations may include one or more vias 382 embedded in base substrate 330 and in direct contact with OPS section 332. Vias 382 may be electrically connected, for example, to electronic components 352, 354 and/or 356. Vias 382 may be formed, for example, of any suitable conductive material, for example, Copper. Vias 382 may be formed, for example, using any suitable conductor patterning and/or electroplating process, e.g., as is known in the art.

Although the invention is not limited in this respect, in some demonstrative embodiments of the invention the AR of one or more of vias 382 may be larger than one, for example, larger than two, e.g., larger than 10.

It is noted that embodiments of the present invention may include units and/or sub-units, which may be separate of each other or combined together, and may be implemented using specific, multi-purpose or general devices as known in the art.

While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. A process comprising:
   forming at least one inter-layer-dielectric section within a base substrate,
   forming one or more embedded vias in said base substrate and in direct contact with said inter-layer dielectric section; and
   attaching one or more electronic components to said base substrate before forming said vias.

2. The process of claim 1, wherein attaching said one or more electronic components comprises attaching one or more elements of an embedded integrated circuit.

3. The process of claim 1, wherein attaching said one or more electronic components comprises attaching one or more elements of a Micro-Electro-Mechanical Systems device.

4. The process of claim 1, comprising applying a package over said one or more electronic components.

* * * * *